(12) United States Patent
Pandolfi

(10) Patent No.: US 8,309,938 B2
(45) Date of Patent: Nov. 13, 2012

(54) ION BEAM INCIDENT ANGLE DETECTION ASSEMBLY AND METHOD

(75) Inventor: Thomas A. Pandolfi, Rockport, MA (US)

(73) Assignee: Varian Semiconductor Equipment Associates, Inc., Gloucest, MA (US)

( * ) Notice: Subject to any disclaimer, the term of this patent is extended or adjusted under 35 U.S.C. 154(b) by 453 days.

(21) Appl. No.: 12/568,781

(22) Filed: Sep. 29, 2009

(65) Prior Publication Data

US 2011/0073777 A1     Mar. 31, 2011

(51) Int. Cl.
*H01J 37/08* (2006.01)
(52) U.S. Cl. .................... 250/398; 255/397; 255/492.21
(58) Field of Classification Search .................. 250/398, 250/397, 492.21
See application file for complete search history.

(56) References Cited

U.S. PATENT DOCUMENTS

| | | | |
|---|---|---|---|
| 6,677,598 B1 | 1/2004 | Benveniste | |
| 6,852,984 B2 * | 2/2005 | Krueger | 250/397 |
| 6,989,545 B1 * | 1/2006 | Rathmell et al. | 250/492.21 |
| 7,109,499 B2 * | 9/2006 | Angel et al. | 250/492.21 |
| 7,394,073 B2 * | 7/2008 | Cummings et al. | 250/397 |

* cited by examiner

*Primary Examiner* — Kiet T Nguyen

(57) ABSTRACT

In an ion implanter, a detector assembly is employed to monitor the ion beam current and incidence angle at the location of the work piece or wafer. The detector assembly includes a plurality of pairs of current sensors and a blocker panel. The blocker panel is disposed a distance away from the sensors to allow certain of the beamlets that comprise the ion beam to reach the sensors. Each sensor in a pair of sensors measures the beam current incident thereon and the incident angle is calculated using these measurements. In this manner, beam current and incidence angle variations may be measured at the work piece site and be accommodated for, thereby avoiding undesirable beam current profiles.

19 Claims, 5 Drawing Sheets

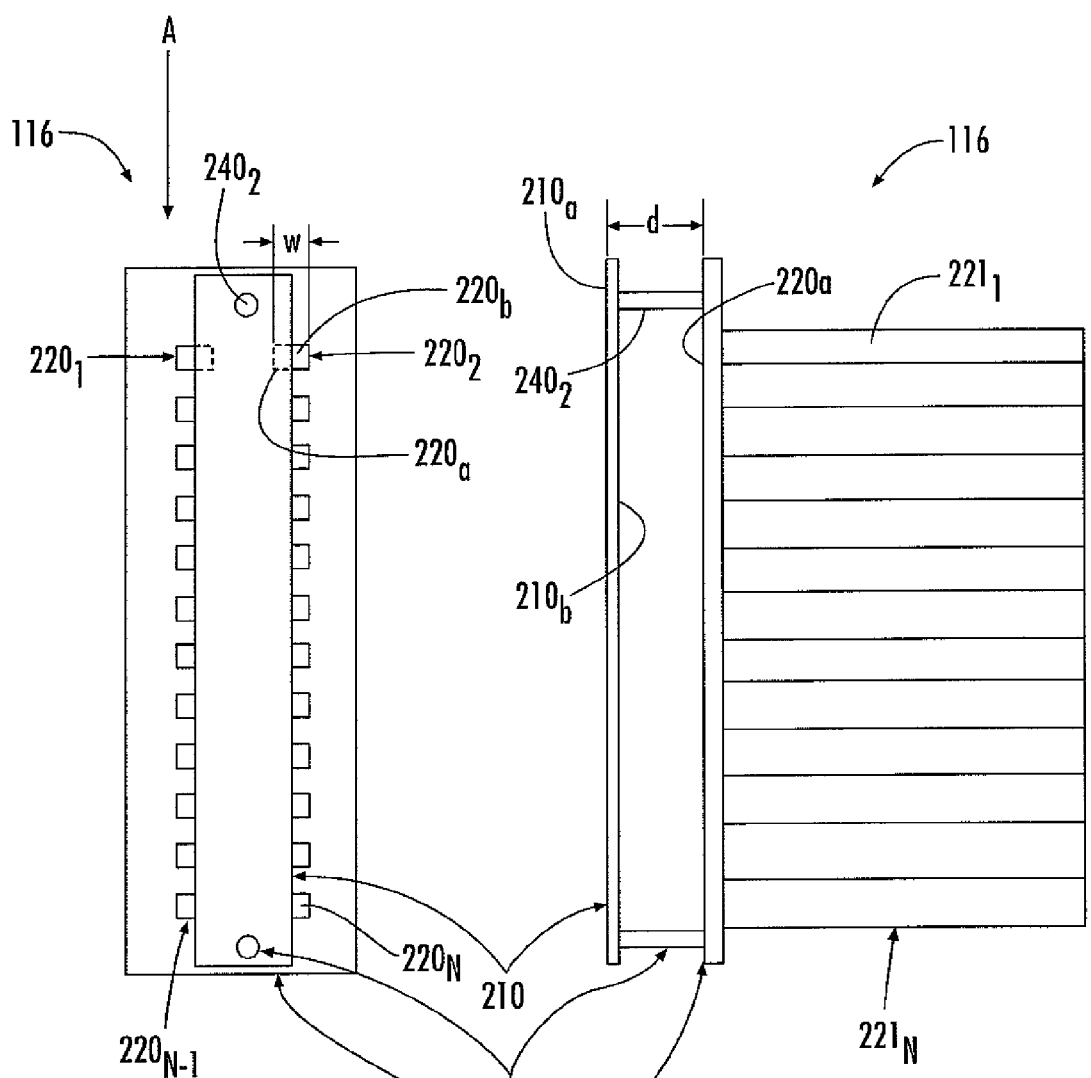
FIG. 3A
FIG. 3C
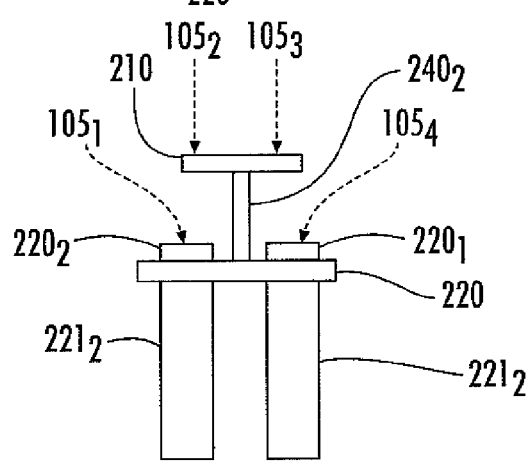
FIG. 3B

ION BEAM INCIDENT ANGLE DETECTION ASSEMBLY AND METHOD

BACKGROUND OF THE INVENTION

1. Field of the Invention

Embodiments of the invention relate to the field of semiconductor device fabrication. More particularly, the present invention relates to an apparatus and method for measuring the incidence angle for an ion beam in an ion implanter.

2. Discussion of Related Art

Ion implantation is a process used to dope impurity ions into a semiconductor substrate to obtain desired device characteristics. A precise doping profile in a semiconductor substrate and associated thin film structure is critical for proper device performance. An ion beam is directed from an ion source chamber toward a substrate. The depth of implantation into the substrate is based on the ion implant energy and the mass of the ions generated in the source chamber. In addition, the beam dose (the amount of ions implanted in the substrate) and the beam current (the uniformity of the ion beam) can be manipulated through the use of a mass analyzing magnet, a corrector magnet and one or more acceleration and deceleration stages along the ion beam path to provide a desired doping profile in the substrate. However, throughput or manufacturing of semiconductor devices is highly dependent on the uniformity of the ion beam on the target substrate to produce the desired device characteristics.

Generally, beam current, energy contamination and uniformity both of ion beam current density and angle of implantation are the parameters that jeopardize device throughput during semiconductor manufacturing processes. For example, if the beam current is too low, this will reduce the throughput of the implanter for a given total ion dose. Energy contamination occurs when there is a small fraction of the ion beam that is at a higher energy than desired. This small fraction of the ion beam at a higher energy level will rapidly increase the depth of the desired junction that is formed in the substrate when creating an integrated circuit and lead to degraded performance of the desired circuit profile. If the ion beam current density and angle of implantation are not uniform, there will be variations in the device properties formed across the semiconductor substrate. These variations in beam current and angle of implantation can compromise the desired device characteristics which could produce lower manufacturing yields and lead to higher processing costs. Thus, there is a need to control at least one or more of these parameters to provide current uniformity for ion implantation systems when manufacturing semiconductor devices.

SUMMARY OF THE INVENTION

Exemplary embodiments of the present invention are directed to an apparatus for measuring the incidence angles of an ion beam in an ion implanter. In an exemplary embodiment, an ion beam detector assembly includes a plurality of pairs of ion current sensors disposed along a path of an ion beam in an ion implanter. Each of the pairs of ion current sensors is disposed on a detector array along a perpendicular axis with respect to the ion beam. The detector assembly starts from a position outside of the ion beam path and moves across the beam and terminates outside the beam path on the opposite side. As the detector assembly moves across the beam a first of the current sensors detects a first beam current, and a second of the current sensors detects a second beam current where each of the first and second detected beam currents are used to determine an angle of incidence of the ion beam. A blocker panel is disposed a distance 'd' upstream from the plurality of pairs of ion current sensors. The blocker panel is configured to block portions of the ion beam having a first group of angles of incidence from reaching a first section of each of the ion current sensors and allowing portions of the ion beam having a second group of angles of incidence to reach a second section of each of the ion current sensors.

In an exemplary method of measuring angles of incidence of an ion beam includes replacing a target wafer with an ion beam detector assembly having a plurality of current sensors. An ion beam is provided which is incident on the detector assembly. The beam current associated with the ion beam is detected by the plurality of current sensors. The detector assembly moves across the ion beam measuring beam currents. The angle of incidence of the ion beam is calculated using the detected beam currents from the plurality of current sensors. The angles of incidence are analyzed to determine the uniformity of the ion beam. The beam current is adjusted based on the calculated incidence angles.

BRIEF DESCRIPTION OF THE DRAWINGS

FIG. 3A is a front view of the detector assembly of FIG. 2 in accordance with an embodiment of the present invention.

FIG. 3B is an end view of the detector assembly of FIG. 2 in accordance with an embodiment of the present invention.

FIG. 3C is a side view of the detector assembly of FIG. 2 in accordance with an embodiment of the present invention.

DESCRIPTION OF EMBODIMENTS

Figure 1:
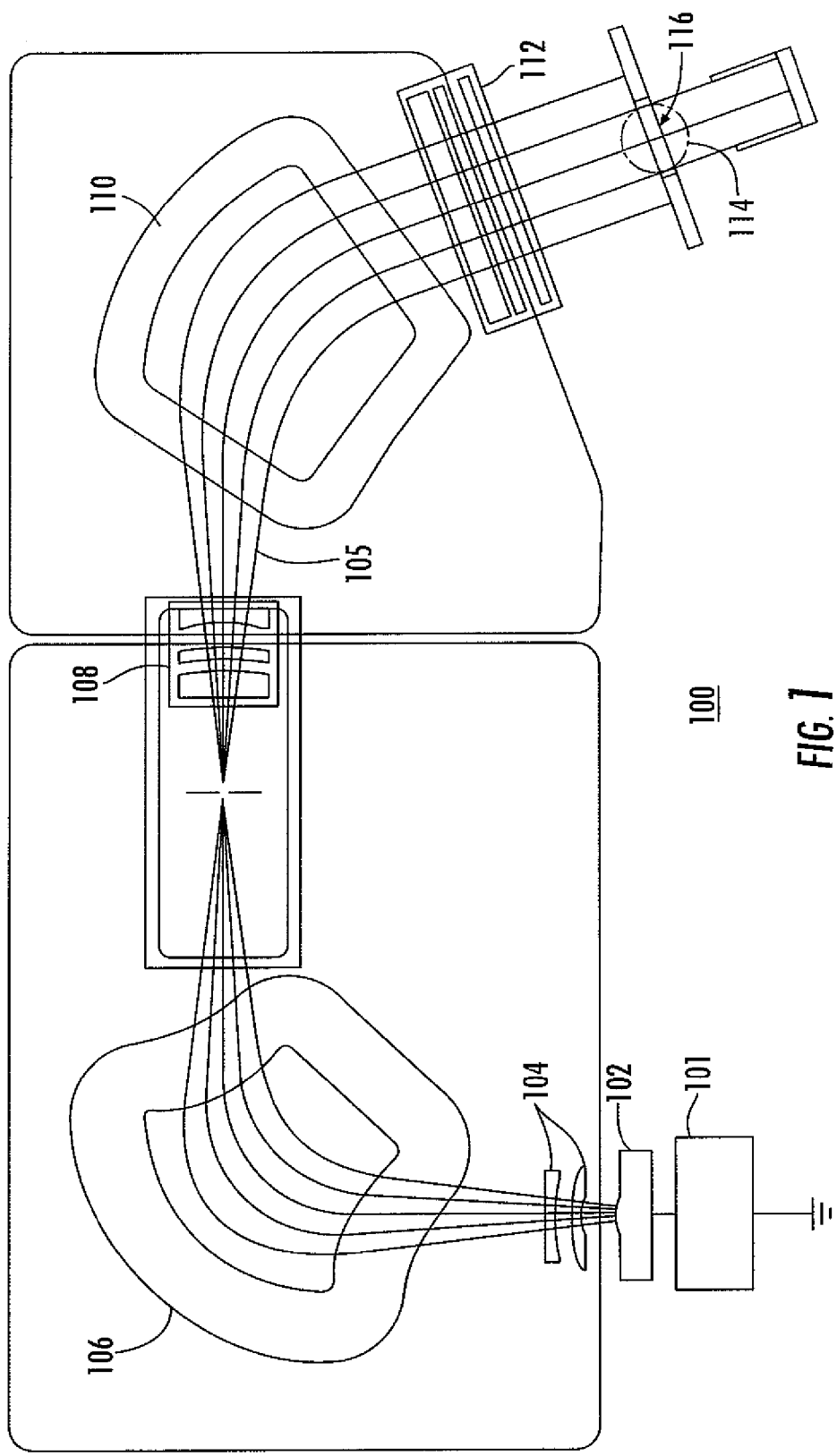
FIG. 1 illustrates a block diagram of a representative ion implanter including an incident angle detector assembly in accordance with an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a block diagram of an exemplary ion implanter 100 including an ion source chamber 102. A power supply 101 supplies the required energy to source 102 which is configured to generate ions of a particular species. The ion source chamber 102 typically includes a heated filament which ionizes a feed gas introduced into the chamber to form charged ions and electrons (plasma). The heating element may be, for example, a Bernas source filament, an indirectly heated cathode (IHC) assembly or other thermal electron source. Different feed gases are supplied to the ion source chamber to obtain ion beams having particular dopant characteristics. For example, the introduction of $H_2$, $BF_3$ and $AsH_3$ at relatively high chamber temperatures are broken down into mono-atoms having high implant energies. High implant energies are usually associated with values greater than 20 keV. For low-energy ion implantation, heavier charged molecules such as decaborane, carborane, etc., are introduced into the source chamber at a lower chamber temperature which preserves the molecular structure of the ionized molecules having lower implant energies. Low implant energies typically have values below 20 keV.

The generated ions are extracted from the source through a series of electrodes 104 and formed into a beam 105 which passes through a mass analyzer magnet 106. The mass analyzer is configured with a particular magnetic field such that only the ions with a desired mass-to-charge ratio are able to travel through the analyzer for maximum transmission through a mass resolving slit and onto deceleration stage 108. The deceleration stage comprising multiple electrodes with defined apertures that allow the ion beam to pass. By applying different combinations of voltage potentials to these electrodes, the deceleration stage manipulates the ion energies in the beam.

Corrector magnet 110 is disposed downstream of the deceleration state and is energized to deflect ion beamlets in accordance with the strength and direction of the applied magnetic field to provide a ribbon beam targeted toward a work piece or substrate 114 positioned on a support or platen. In other words, the corrector magnet shapes the ion beam generated from the deceleration stage into the correct form for deposition onto the workpiece. In addition, the corrector magnet filters out any ions from the beam that may have been neutralized while traveling through the beam line. In some embodiments, a second deceleration stage 112 may be disposed between corrector magnet 110 and target work piece 114. This second deceleration stage comprising a deceleration lens receives the ion beam from the corrector magnet and further manipulates the energy of the ion beam before it hits the workpiece 114.

As the beam hits the work piece 114, the ions in the beam penetrates the work piece coming to rest beneath the surface to form a region of desired conductivity, whose depth is determined by the energy of the ions. In order to ensure that the ions penetrate the work piece at a desired incident angle and beam current, system 100 includes detector assembly 116 having a plurality of sensors such as, for example Faraday cups, configured to detect the beam current measured at various points along the path through the ion beam 105. The changes in beam current relative to the various measured points using the detector assembly 116 yields a measurement of the ion beam incident angle as described with respect to the process outlined below. The detector assembly 116 replaces work piece 114 and the profile measured at each of these sensors is used to determine the angle of incidence of the beam 105. Based on these measurements, the profile may be modified to improve implant uniformity. Once the desired beam current and incident angle is obtained, the detector assembly 116 is replaced with work piece 114 and the detector assembly is removed from the beam line. In this manner, feedback from the detector assembly may be used to manipulate electromagnets along the beam line to provide a desired beam profile.

Figure 1A:
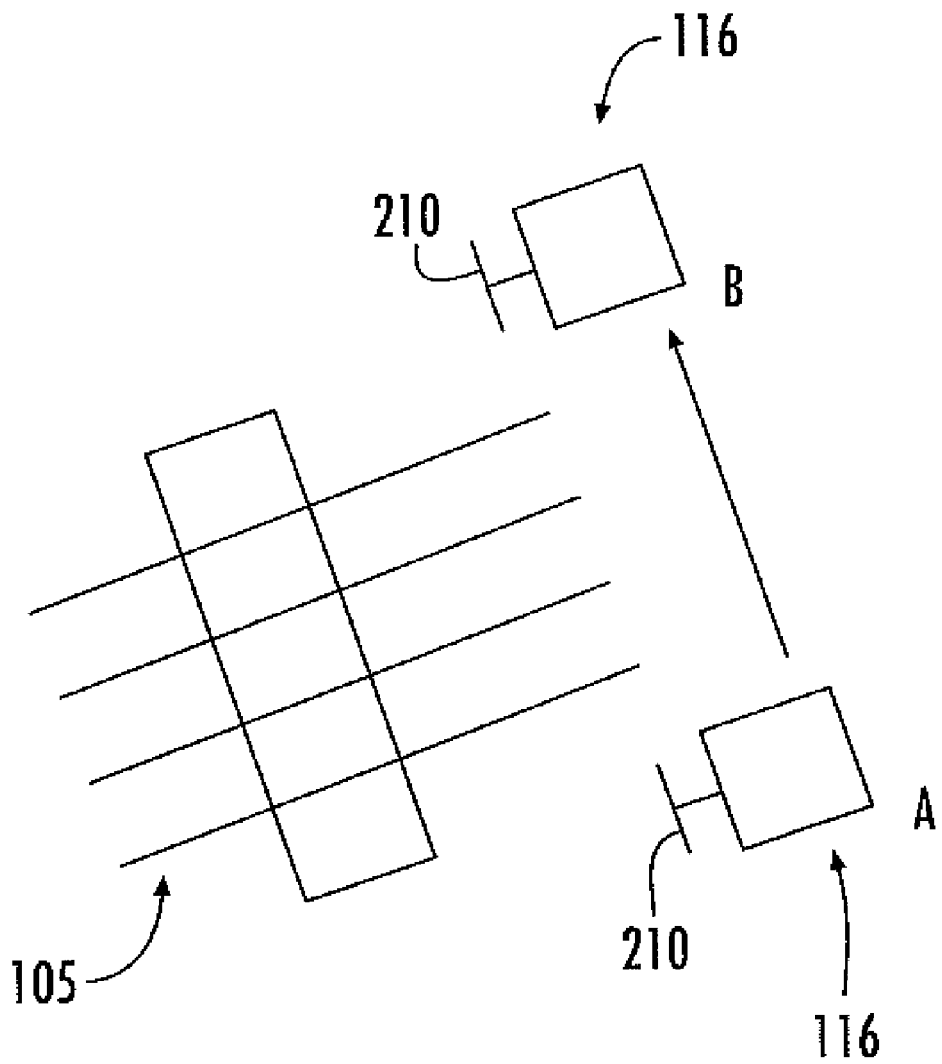
FIG. 1A is a schematic view of the movement of the detector assembly with respect to the ion beam path in accordance with an embodiment of the present invention.

FIG. 1A is a schematic drawing illustrating the movement of detector assembly 116 from a starting position A to an end position B. Detector assembly 116 starts from a position A outside of the ion beam path, moves horizontally across the beam 105 and terminates at a position B outside the beam path on the opposite side thereof. As the assembly moves across the beam 105 and the current values detected by each of the detector elements is recorded. The position of the detector assembly 116 as it moves across the beam is also recorded and associated with the corresponding current value detected by the respective detector element.

Figure 2:
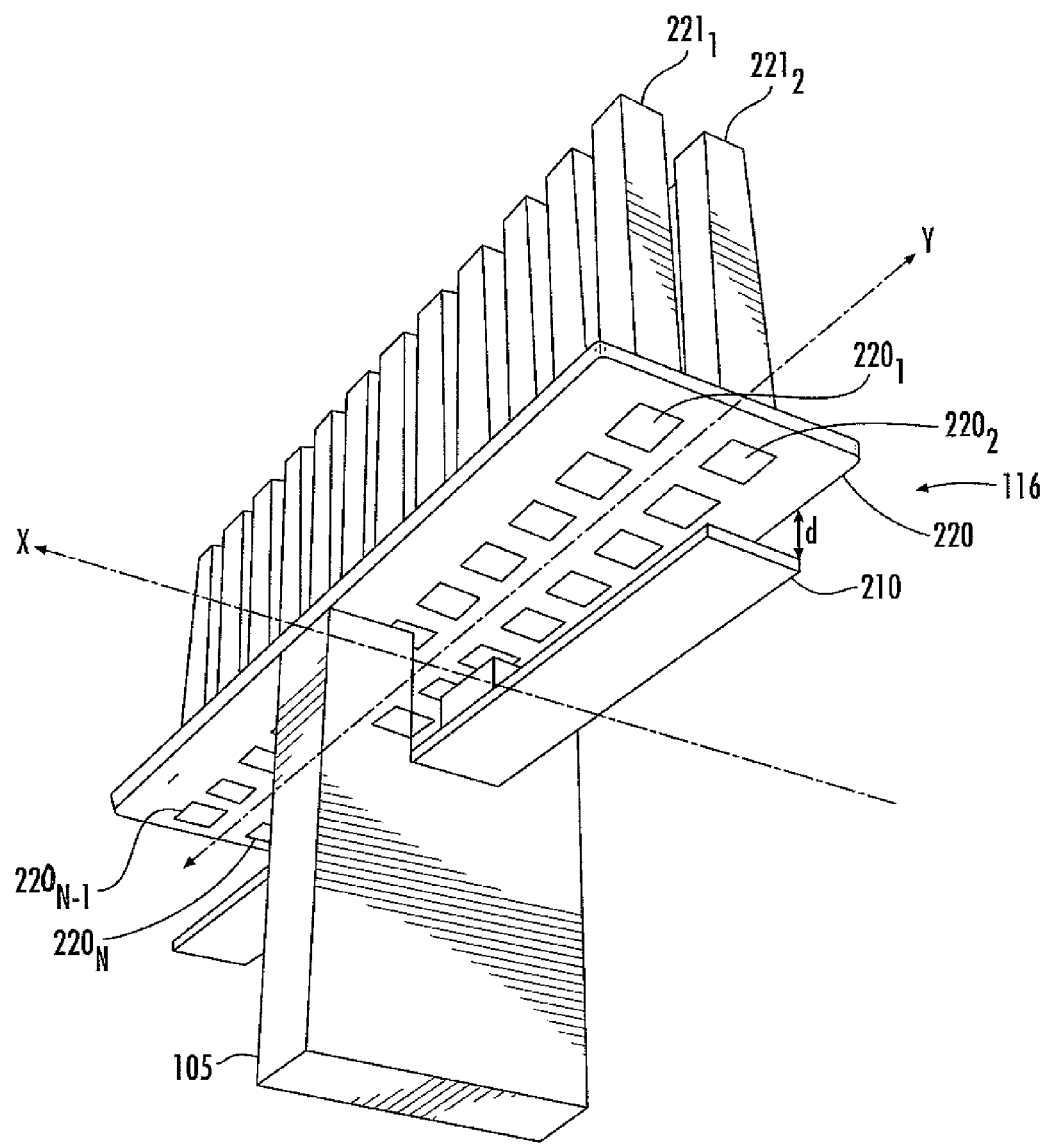
FIG. 2 is a perspective view of an exemplary detector assembly in accordance with an embodiment of the present invention.

FIG. 2 is a perspective view of detector assembly 116 including a blocker panel 210 and a graphite array 220 having Faradays defined by Faraday pixels $220_1 \ldots 220_N$ and Faraday bodies $221_1 \ldots 221_N$ disposed therein. The blocker panel 210 is disposed a given distance "d" away from the array 220. The Faradays are arranged in pairs along the X axis and are configured to receive a portion of the ion beam not blocked by panel 210. Each Faraday measures the beam current as the assembly 200 is moved in direction X. In particular, each Faraday receives a portion of the analyzed beam 105 and produces an electrical current based on the representative current thereof. Each Faraday is connected to a current meter to detect the amperage (e.g. mA) and based on the area of the respective Faraday pixel $220_1 \ldots 220_N$, determines the current (e.g. mA/cm2) of the ion beam received by the Faraday. For explanation purposes, the beam 105 shown in FIG. 2 is a portion of the beam typically incident on a work piece. The body portions $221_1 \ldots 221_N$ of the Faradays extend a distance in direction Z in order to prevent the beamlets of beam 105 which enter pixels $220_1 \ldots 220_N$ froth escaping. As beam 105 is incident on Faraday pixels $220_1$ and $220_2$, the beam current is measured by the respective Faradays and the incident angle A of the beam 105 on the particular pixels is calculated by using the following equation:

$$A = \text{ArcTan}(((Ia-Ib)*w)/((Ia+Ib)*2d)) \quad \text{(Equation 1)}$$

where Ia and Ib are the beam currents measured at a first and second of a pair of Faraday pixels (e.g. Faraday pixels $220_1$ and $220_2$), 'w' is the width of a particular one of the array of Faraday pixels $220_1 \ldots 220_N$ and d is the distance from blocker panel 210 to array 220 (as illustrated in FIGS. 3A-3C). Because of the different positions of each of the pixels $220_1 \ldots 220_N$ along the array 220, each measures different amounts of the beam current depending on the angle of incidence for the particular Faraday. In this manner, N/2 pairs of Faradays are used to provide a two-dimensional array of incident angles of beam 105 in direction Y based on the number of detectors in direction X. The two dimensional array of angles is used to adjust the lenses and magnets in the ion implanter to obtain the desired beam angles incident on a work piece. In addition, the larger the distance d, the greater the resolution of the incident angles. However, a process trade off exists between greater angle resolution versus detection of smaller incident angles. The calculation of incidence angles can be repeated and the until the array of incidence angles is acceptable for a particular implantation profile.

FIG. 3B is a front view of the detector assembly 116 shown in FIG. 2 including a blocker panel 210 and graphite array 220 housing pairs of Faraday pixels $220_1 \ldots 220_N$. Each of the pixels $220_1 \ldots 220_N$ has a width "w", a first portion of which is disposed behind blocker panel 210 and a second portion of which is not disposed behind blocker panel 210. Although part of a pixel is behind blocker panel 210, each pixel is configured to detect a portion of ion beam 105 incident thereon. The pixels $220_1 \ldots 220_N$ are shown in pair-wise linear columns where the current detected by each pixel pair used to determine the incident angle in accordance with Equation 1 above. A first blocker support post $240_1$ is connected to graphite array 220 and blocker panel 210 at a first end of detector assembly 116. A second blocker support post $240_2$ is connected to graphite array 220 and blocker panel 210 at a second end of detector assembly 116. Blocker panel 210 is a substantially rectangular piece of graphite, however alternative conductive materials and shapes may be employed. In addition, blocker panel 210 may also be capable of rotation away from array 220 about one of the support posts 240. This may be done to allow calibration of the detectors in the array.

Blocker panel 210 is configured to block beamlets of the incident ion beam 105 from reaching the first portion of each Faraday pixel $220_1 \ldots 220_N$. For example, a first portion $220a$ of pixel $220_2$ which has a width approximately w/2 is disposed behind blocker panel 210 and can only receive beamlets of ion beam 105 which are incident thereon at an angle with respect to the planar surface of the array 220. In other words, beamlets of the ion beam 105 which are perpendicular to first portion $220a$ of pixel $220_2$ will be blocked by blocker panel 210. Similarly, beamlets of the ion beam 105 which are less than orthogonal on pixel portion $220a$ (i.e. toward pixel $220_1$) will likewise be blocked from reaching pixel portion $220a$ by blocker panel 210. However, second pixel portion $220b$ of pixel $220_2$ which is also has a width of approximately w/2 is not disposed behind blocker panel 210 and therefore is configured to receive beamlets of the ion beam 105 which are substantially orthogonal to pixel portion $220b$ and beamlets of the ion beam 105 which are less than orthogonal to pixel portion $220b$. The width of each of the pixel portions $220a$ and $220b$ may have alternative dimensions depending on the range of incident angles being detected.

The relationship of the Faraday pixels and the ion beam 105 is illustrated more clearly in FIG. 3B which is an end view of detector assembly 116 taken in direction A. FIG. 3B illustrates blocker panel 210, blocker support post $240_2$ array 220, pixel pair $220_1$ and $220_2$ and pixel bodies $221_1$ and $221_2$, respectively. By way of example, beamlets $105_1 \ldots 105_4$ are incident on Faraday pixels $220_1$ and $220_2$ of detector assembly 116. Beamlet portion $105_1$ of ion beam 105 is incident on and received by pixel $220_2$ at an incident angle. Beamlet portion $105_2$ is orthogonal to pixel $220_2$ and is blocked by blocker panel 210. Beamlet portion $105_3$ of ion beam 105 is orthogonal to pixel $220_1$ and is blocked by blocker panel 210. Beamlet portion $105_4$ of ion beam 105 is incident on and received by pixel $220_1$ at an incident angle. In this example, each of the Faraday pixels $220_1$ and $220_2$ detects the current density of the incident ion beam and the detector determines the incident angles in accordance with Equation 1 above.

FIG. 3C is a side view of detector assembly 116 illustrating the distance d between blocker panel 210 and array 220. In particular, distance d is measured from first surface $210a$ of blocker panel 210 to first surface $220a$ of array 220. Support posts $240_1$ and $240_2$ are disposed between first surface $220a$ of array 220 and second surface $210b$ of blocker panel 210. Each of the support posts may extend into respective bores (not shown) in blocker panel 210. Alternatively, support posts $240_1$ and $240_2$ may be adjustably configurable to vary the distance d between blacker panel 210 and array 220. Faraday bodies 2211 . . . 221N extend from array 220 in order to prevent the beamlets of beam 105 which enter pixels $220_1 \ldots 220_N$ from escaping and thereby detecting the received beam current.

Figure 4:
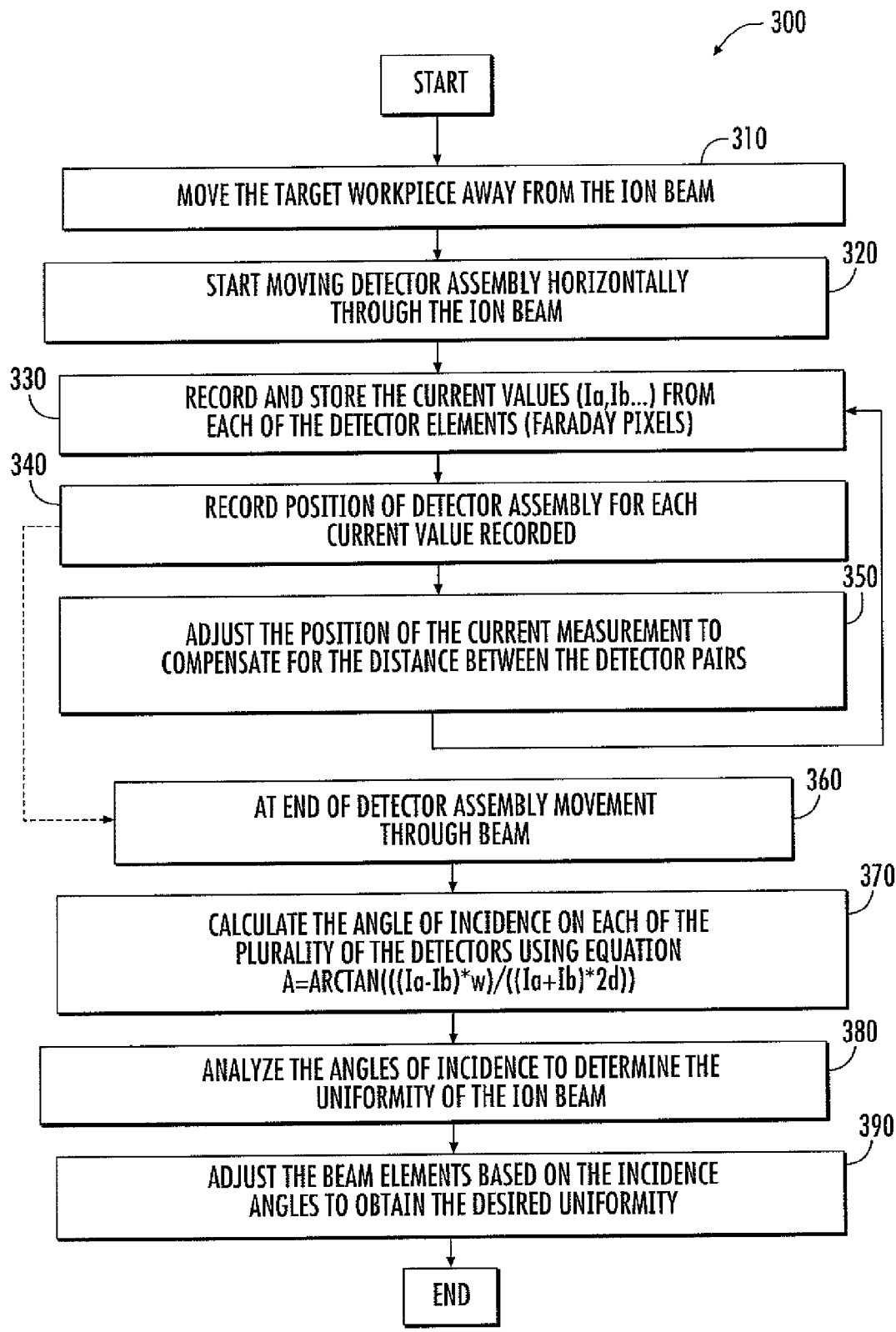
FIG. 4 is a flow diagram illustrating an exemplary method of monitoring uniformity of ion implantation in accordance with an embodiment of the present invention.

FIG. 4 is a flow diagram illustrating an exemplary method 300 of monitoring uniformity of an ion beam in an ion implantation system. At step 310, a target work piece is moved away from the ion beam and the detector assembly replaces the work piece to tune a desired implant profile. The detector is provided with a plurality of pairs of Faraday pixels to detect beam currents incident on the pixels. At step 320, the detector assembly is moved horizontally through the ion beam. The current values of the beam incident on each of the pairs of Faraday pixels are recorded and stored at step 330. For example, the current associated with detector $220_1$ is recorded and stored and the current associated with the corresponding other of the pair of detectors $220_2$ is recorded and stored. At step 340, the position of the detector assembly for each of the current values in step 330 is recorded. The positions of the current measured at step 340 is adjusted to compensate for the distance between the detector pairs at step 350. In other words, the detected currents will have positions that differ by the horizontal separation of each of the detectors in a pair. Once the detector assembly has passed completely through the ion beam at step 360, the assembly is stopped and the beam angles are calculated. In particular, the angle of incidence of the beam on each pair of the plurality of pairs of detectors is calculated at step 370 using the formula A=ArcTan(((Ia−Ib)*w)/((Ia+Ib)*2d)) where A is the incident angle, Ia and Ib are the beam currents measured at a first and second of a pair of Faraday pixels, 'w' is the width of a particular one of the array of Faraday pixels and d is the distance from a blocker panel 210 to the Faraday array 220. This calculation at provides a two dimensional array of angles in the Y direction based on the number of detectors in the X direction based on the number of current measurements performed as the detector assembly 116 moved across the ion beam. The angles of incidence are analyzed to determine the uniformity of the ion beam at step 380. At step 390, the beam current is adjusted based on the two dimensional array of angles calculated by adjusting the lenses and magnets to obtain the desired beam profile. This procedure may be repeated until the array of angles is acceptable indicating that the lenses and magnets in the ion implanter is appropriate for the given profile.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An ion beam detector assembly comprising
a plurality of pairs of ion current sensors disposed along a path of an ion beam in an ion implanter, each of said pairs of ion current sensors disposed on a detector array along an axis perpendicular to the ion beam, a first of said pair of current sensors detecting a first beam current, and a second of said pair of current sensors detecting a second beam current wherein each of said first and second detected beam currents is used to determine an angle of incidence of the ion beam; and
a blocker panel disposed a distance 'd' upstream from the plurality of pairs of ion current sensors, said blocker panel configured to block portions of the ion beam having a first group of angles of incidence from reaching a first section of each of said ion current sensors and allowing portions of the ion beam having a second group of angles of incidence to reach a second section of each of said ion current sensors,
wherein each of said sensors has a width "w", wherein approximately w/2 of each of said sensors is disposed underneath said blocker panel and approximately w/2 of each of said sensor is not disposed underneath said blocker panel.

2. The ion beam detector assembly of claim 1 further comprising multiple support posts disposed between said blocker panel and said detector array.

3. The ion beam detector assembly of claim 1 wherein the angles of incidence is a function of the distance "d" between the blocker panel and the pairs of ion current sensors, width "w" of each of the sensors and the first and second detected beam currents.

4. The ion beam detector assembly of claim 1 wherein each of the sensors detects the ion beam current as the assembly moves across the ion beam.

5. The ion beam detector assembly of claim 1 wherein the detector array is comprised of graphite.

6. The ion beam detector assembly of claim 1 wherein the angle of incidence A is obtained using the following formula: $A=ArcTan(((Ia-Ib)*w)/((Ia+Ib)*2d))$ where Ia and Ib are the detected beam currents measured at the first and second of the pair of the ion current sensors.

7. The ion beam detector assembly of claim 1 wherein the plurality of pairs of ion current sensors are Faraday cups each defined by a Faraday pixel and a Faraday body.

8. The ion beam detector assembly of claim 1 wherein the detector array has a predefined surface area and said blocker panel has a substantially rectangular shape such that said blocker panel covers more than ½ the surface area of said detector array.

9. A method of measuring angles of incidence of an ion beam comprising:
replacing a target wafer with an ion beam detector assembly having plurality of pairs of ion current sensors;
providing an ion beam incident on the detector assembly;
detecting the beam current associated with each of the plurality of current sensors;
calculating the angle of incidence on each of the plurality of current sensors using the detected beam currents;
analyzing the angles of incidence to determine the uniformity of the ion beam; and
adjusting the beam current based on the calculated incidence angles,
wherein the step of calculating the angle of incidence further con rises using the following formula: $A=ArcTan((Ia-Ib)*w)/((Ia+Ib)*2d))$ where Ia and Ib are the detected beam currents measured at first and second of plurality of pairs of ion current sensors.

10. The method of claim 9 wherein each of said sensors has a width "w".

11. The method of claim 10 wherein the detector assembly includes a blocker panel disposed a distance "d" away from the plurality of current sensors.

12. An ion beam detector assembly comprising
a plurality of pairs of ion current sensors disposed along a path of an ion beam in an ion implanter, each of said pairs of ion current sensors disposed on a detector array along an axis perpendicular to the ion beam, a first of said pair of current sensors detecting a first beam current, and a second of said pair of current sensors detecting a second beam current wherein each of said first and second detected beam currents is used to determine an angle of incidence of the ion beam; and
a blocker panel disposed a distance 'd' upstream from the plurality of pairs of ion current sensors, said blocker panel configured to block portions of the ion beam having a first group of angles of incidence from reaching a first section of each of said ion current sensors and allowing portions of the ion beam having a second group of angles of incidence to reach a second section of each of said ion current sensors,
wherein the detector array has a predefined surface area and said blocker panel has a substantially rectangular shape such that said blocker panel covers more than ½ the surface area of said detector array.

13. The ion beam detector assembly of claim 12 further comprising multiple support posts disposed between said blocker panel and said detector array.

14. The ion beam detector assembly of claim 12 wherein each of said sensors has a width "w", wherein approximately w/2 of each of said sensors is disposed underneath said blocker panel and approximately w/2 of each of said sensors is not disposed underneath said blocker panel.

15. The ion beam detector assembly of claim 14 wherein the angles of incidence are a function of the distance "d" between the blocker panel and the pairs of ion current sensors, width "w" of each of the sensors and the first and second detected beam currents.

16. The ion beam detector assembly of claim 14 wherein the angle of incidence A is obtained using the following formula: $A=ArcTan((Ia-Ib)*w)/((Ia+Ib)*2d))$ where Ia and Ib are the detected beam currents measured at the first and second of the pair of the ion current sensors.

17. The ion beam detector assembly of claim 12 wherein each of the sensors detects the ion beam current as the assembly moves across the ion beam.

18. The ion beam detector assembly of claim 12 wherein the detector array is comprised of graphite.

19. The ion beam detector assembly of claim 12 wherein the plurality of pairs of ion current sensors are Faraday cups each defined by a Faraday pixel and a Faraday body.

* * * * *